United States Patent [19]
Georges et al.

[11] Patent Number: 5,631,916
[45] Date of Patent: May 20, 1997

[54] APPARATUS AND METHOD FOR OPTICALLY TRANSMITTING ELECTRICAL SIGNALS IN THE 20-300 GIGAHERTZ FREQUENCY RANGE

[76] Inventors: John B. Georges, 2117 Rose St., Apt. 5, Berkeley, Calif. 94709; Kam Y. Lau, 3499 Shadow Creek Dr., Danville, Calif. 94506

[21] Appl. No.: 432,452

[22] Filed: May 1, 1995

[51] Int. Cl.$^6$ .......................................... H01S 3/10
[52] U.S. Cl. .................................. 372/28; 372/26
[58] Field of Search .......................... 372/26, 28

[56] References Cited

U.S. PATENT DOCUMENTS

| | | | |
|---|---|---|---|
| 5,311,526 | 5/1994 | Garfinkel et al. | 372/26 |
| 5,325,382 | 6/1994 | Emura et al. | 372/26 |
| 5,414,552 | 5/1995 | Godil | 372/26 |

*Primary Examiner*—James W. Davie
*Attorney, Agent, or Firm*—Lumen Intellectual Property Services

[57] ABSTRACT

The invention discloses a method and an apparatus for optically transmitting a narrow-band optical signal beam having a sub-carrier frequency in the 20 to 300 GHz range. The apparatus has a semiconductor laser with a lasing cavity of length L. The length L preferably ranges from less than 1 mm to 10 mm, thereby defining the round-trip resonance frequency according to the following equation c/2 nL. The apparatus has a signal source for generating an electrical modulating signal having a modulation frequency contained in a narrow band containing the round-trip resonance frequency. An in-coupling means delivers the electrical modulating signal to the semiconductor laser which produces a sub-carrier modulated signal beam whose sub-carrier modulation frequency lies within a response band and corresponds to the modulation frequency. The apparatus further includes a biasing device for providing a biasing voltage for tuning the response band and the sub-carrier modulated signal beam. According to the method of the invention the biasing voltage is used to set the width of the response band and to set a phase shift in the sub-carrier modulated optical signal beam. Varying the biasing voltage thus allows to phase-modulate the sub-carrier modulated optical signal beam.

17 Claims, 4 Drawing Sheets

APPARATUS AND METHOD FOR OPTICALLY TRANSMITTING ELECTRICAL SIGNALS IN THE 20-300 GIGAHERTZ FREQUENCY RANGE

BACKGROUND—FIELD OF THE INVENTION

The present invention relates to the field of transmitting high-frequency (20–300 GHz) electrical signals by converting them into optical signals, and in particular to an apparatus and method for generating such optical signals.

BACKGROUND—DESCRIPTION OF PRIOR ART

High-frequency signals, especially in the 20–300 GHz frequency range, are very useful in transmitting information. These signals have wavelengths on the order of a few millimeters and are thus often referred to as millimeter waves.

Until now millimeter waves were generated in the form of electrical signals and transmitted through suitable waveguides. These typically include aluminium lines of rectangular cross-section. The dimensions, rigidity, and weight of such waveguides are highly restrictive or downright prohibitive in many applications.

To circumvent the above problem efforts have been made to convert electrical millimeter-wave signals into their optical equivalents. Once in the form of optical radiation the signals can be transmitted through the various types of widely available optical waveguides. The waveguide of choice is an optical fiber. Due to its flexibility, light weight, and small cross-section an optical fiber avoids the disadvantages plaguing bulky metal waveguides.

Unfortunately, no effective method has been found for converting the electrical millimeter-wave signals to optical signals. Research-grade, electro-optic transducers, such as semiconductor lasers, can generate optical sub-carrier frequencies ranging up to 30 GHz. These devices, however, are very costly and do not span the 20 to 300 GHz frequency range. Moreover, their complexity renders them impractical for most applications.

The problem encountered in trying to drive semiconductor devices at high sub-carrier frequencies is the inability of the lasing cavity to respond. FIG. 1 shows a simplified response behavior of a commercial semiconductor laser and a research-grade laser. The two corresponding graphs (A, B) illustrate the output power as a function of sub-carrier frequency. The response of the first device dips drastically at approximately 10 GHz and quickly falls off to zero. The research grade laser exhibits a qualitatively similar response with the drop-off commencing just before 30 GHz.

Thus, the present state-of-the-art offers no arrangements or methods for converting electrical millimeter-wave signals to optical signals suitable for transmission over fiber-optic links.

OBJECTS AND ADVANTAGES OF THE INVENTION

In view of the above, it is an object of the present invention to provide an apparatus and method for converting millimeter-wave electrical signals to sub-carrier modulated optical signal beams whose sub-carrier frequency ranges from 20 to 300 GHz. The envisioned apparatus is simple in construction, efficient, and low-cost.

Another object of the invention is to provide a means and a method for tuning the response of this apparatus and for modulating that response.

Yet another object of the invention is to ensure simple in-coupling of the sub-carrier modulated optical signal beam into an optical waveguide.

These and other objects and advantages will become more apparent after consideration of the ensuing description and the accompanying drawings.

SUMMARY OF THE INVENTION

Surprisingly, it has been found that the objects and advantages of the invention are achieved by an apparatus with a properly dimensioned semiconductor laser. In particular, the apparatus of the invention for optically transmitting a narrow-band optical signal beam having a sub-carrier frequency in the 20 to 300 GHz range consists of a semiconductor laser, preferably a Fabry-Perot laser, a Distributed Feedback laser, or a Distributed Bragg Reflector laser with a lasing cavity having a length L. (A number of such narrow-band apparatuses are used to cover the entire frequency range from 20 to 300 GHz.) The round-trip distance of this lasing cavity is defined by twice the length L and corresponds to a round-trip resonance frequency of the lasing cavity. The length L preferably ranges from less than 1 millimeter to 10 millimeters, thereby defining the round-trip resonance frequency according to the following equation:

$$\text{round-trip resonance frequency} = \frac{c}{2nL}$$

wherein c is the speed of light and n is the refractive index of the material making up the semiconductor laser.

The apparatus also has a signal source for generating an electrical modulating signal having a modulation frequency contained in a narrow band, the narrow band containing the round-trip resonance frequency. An in-coupling means is mounted on the semiconductor laser for delivering the electrical modulating signal to the semiconductor laser, thereby producing a sub-carrier modulated signal beam whose sub-carrier modulation frequency lies within a response band and corresponds approximately to the modulation frequency.

An impedance matching device, preferably a microstrip impedance matching circuit, is connected between the signal source and the in-coupling means, preferably one or more contacts, for improving the in-coupling efficiency of the modulating signal into the semiconductor laser. The apparatus further includes a biasing device connected to the in-coupling means for providing a biasing voltage for tuning the response band and the sub-carrier modulated signal beam. The biasing means and the impedance matching device can either be connected to the same or to separate in-coupling contacts.

The sub-carrier modulated optical signal beam is preferably extracted from the semiconductor laser through an output facet and in-coupled into an optical fiber. Appropriate orientation of the fiber ensures efficient in-coupling.

The invention further extends to a method for optically transmitting the narrow-band electrical signal having a frequency in the 20 to 300 GHz range by using the semiconductor laser with the lasing cavity of length L.

According to the method of the invention the semiconductor laser is biased by applying a biasing voltage to the in-coupling means. In fact, the biasing voltage is used to set the width of the response band and to set a phase shift in the sub-carrier modulated optical signal beam. Varying the biasing voltage thus allows to phase-modulate the sub-carrier modulated optical signal beam.

The particulars of the apparatus and the operative steps of the method are further clarified in the below description with reference to the attached drawing figures.

DESCRIPTION

Figure 1:
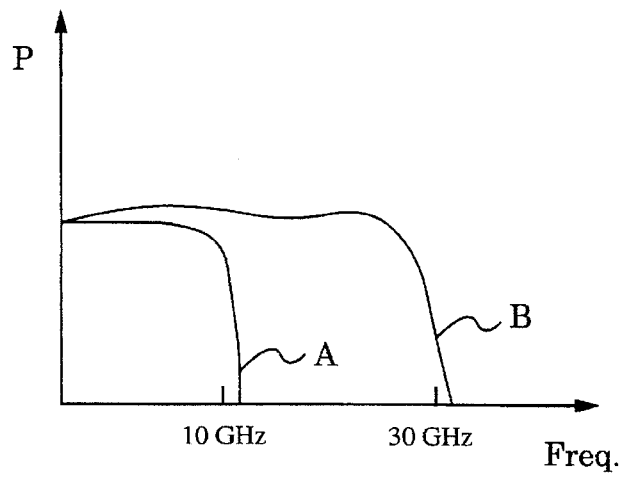
FIG. 1 is a graph of the frequency response of conventional semiconductor lasers.
Figure 2:
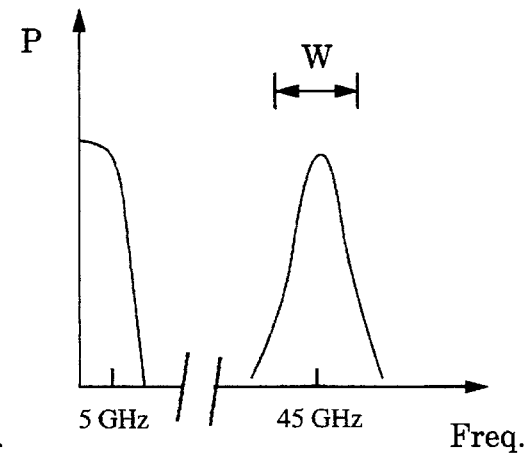
FIG. 2 is a graph of the high-frequency response of a semiconductor laser used in the apparatus of the invention.

This invention is based on the surprising finding that the length of the lasing cavity of a semiconductor laser defines a narrow band of optical frequencies in the 20 to 300 GHz range at which the semiconductor laser can be modulated. This is shown by the graph in FIG. 2, where the y-axis indicates the output sub-carrier modulation power of the laser and the x-axis represents the modulation frequency. A peak of a narrow bandwidth W is observed at a sub-carrier frequency of 45 GHz for a laser having a cavity length of 820 μm. Bandwidth W is typically 50 MHz to 1 GHz wide rendering it useful for sending information signals. The particular embodiments of apparatuses employing this discovery are described below.

Figure 3A:
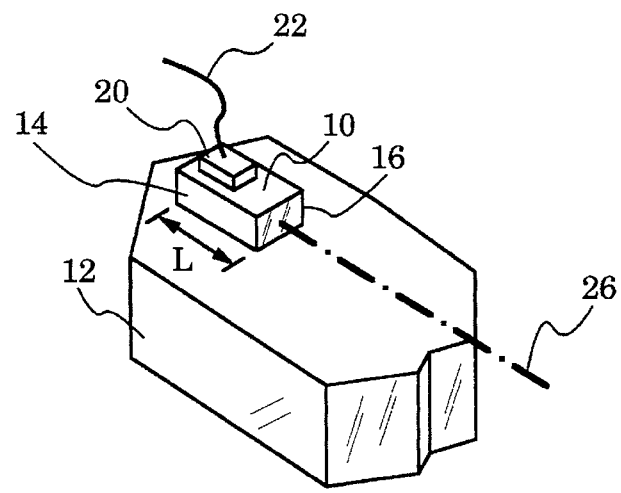
FIG. 3A is a perspective view of a semiconductor laser having a lasing cavity of length L according to the invention.

As shown in FIG. 3A, the most preferred embodiment of the apparatus of the invention uses a semiconductor laser 10 mounted on a substrate 12. Substrate 12 can be a standard gold-plated copper carrier. The methods for producing such lasers on substrates and materials involved are well-known in the art. Semiconductor laser 10 can be a Fabry-Perot (FP) laser, a Distributed Feedback (DF) laser, or a Distributed Bragg Reflector (DBR) laser. Laser 10 contains an internal lasing cavity 14 and an output facet 16. In the simplest case of a FP cavity, assumed in the preferred embodiment, output facet 16 and a reflecting face 18, best seen in the side view of FIG. 3B, on the opposite side of laser 10 define a length L of cavity 14. In other words, length L of cavity 14 is determined by the separation of output facet 16 and reflecting face 18. Of course, this distance can be accurately controlled during the production of laser 10 or thereafter. For example, a finished laser 10 can be cleaved, etched, or otherwise trimmed to length L. Methods for performing such trimming operations on semiconductor laser blocks are well-known in the art.

In the present embodiment length L is 820 μm, but it can range from 600 μm or less to 10 mm and more. The round-trip distance of cavity 14 is defined by twice the length L and corresponds to a round-trip resonance frequency of lasing cavity 14. In fact, the round-trip resonance frequency is defined according to the following equation:

$$\text{round-trip resonance frequency} = \frac{c}{2nL},$$

where c is the speed of light and n is the refractive index of the material making up diode laser 10.

An in-coupling contact 20 with lead 22 is deposited on top of laser 10. The methods for depositing contact 20 and materials of which it is made are standard. For example, contact 20 may be made of gold and be grown by vapor deposition. Lead 22 serves to deliver electrical modulating signals to contact 20 and ultimately laser 10. Since the signals used have modulation frequencies in the 20 to 300 GHz range lead 22 is typically a 10–20 mil long bond wire. Of course, any other well-known electrical arrangement for coupling in frequencies in that range can be used instead of lead 22.

A signal source 24 supplies lead 22 with an electrical modulating signal. Source 24 is capable of generating modulation frequencies in the 20 to 300 GHz range. In this embodiment source 24 is set to deliver modulation frequencies contained within the narrow band of width W=100 MHz centered about 45 GHz, which is the round-trip resonance frequency of lasing cavity 14.

Figure 3B:
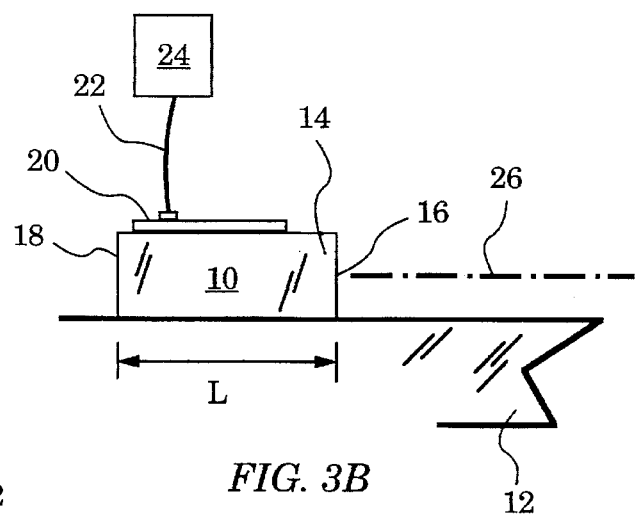
FIG. 3B is a side view of an apparatus of the invention using the semiconductor laser of FIG. 3A.

The preferred embodiment of FIGS. 3A and 3B is driven by signal source 24 while laser 10 is pumped to lase at its usual stimulated optical emission frequency. It should be noted that the actual lasing frequency or frequencies can be centered, e.g., at 850 nm, 1,300 nm, or 1,500 nm, with an optical mode spacing of c/2nL. In this particular embodiment laser 10 is a laser diode emitting at 850 nm.

The electrical modulating signal has a modulation frequency selected in bandwidth W, preferably close to 45 GHz to ensure a good response. The modulating signal travels through lead 22 and in-coupling contact 20 to laser 10. Feeding this modulating signal into laser 10 causes a sub-carrier modulated optical signal beam 26 to be emitted at the modulation frequency, which is inside bandwith W of the response.

Thus, the apparatus of invention converts millimeter-wave electrical modulating signals to a sub-carrier modulated optical signal beam 26 whose sub-carrier frequency is 45 GHz. By appropriately selecting length L the apparatus of the invention can span the entire frequency range from 20 to 300 GHz. The apparatus is simple in construction, efficient, and low-cost, since any semiconductor laser can be easily trimmed to have a lasing cavity of desired length L.

Of course, in order to code useful information in optical signal beam 26 the modulating signal has to be controlled. This is done by properly modulating signal source 24 Additional tuning of the modulating signal and response bandwidth W can also be accomplished by introducing some modifications to the apparatus. The embodiment of the invention shown in FIG. 4 has the structure to permit one to tune the modulating signal.

Figure 4:
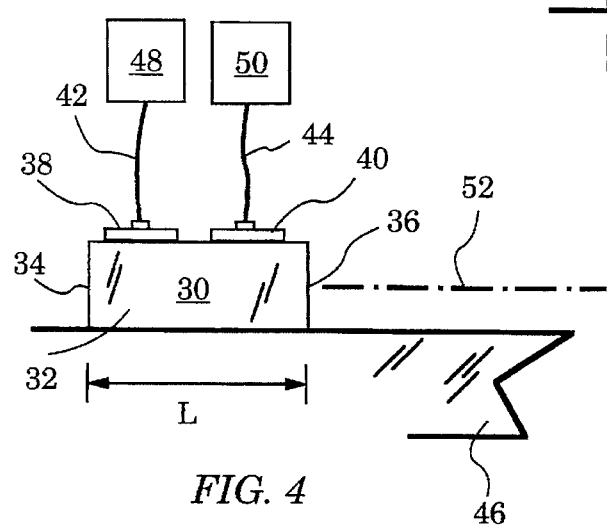
FIG. 4 is a side view of a semiconductor laser with two contacts according to the invention.

In particular, FIG. 4 illustrates a diode laser 30 on a substrate 46. Laser 30 has a lasing cavity 32 of length L. Furthermore, laser 30 has a back or reflecting face 34 and an output facet 36. A first in-coupling contact 38 and a second in-coupling contact 40 are mounted on top of laser 30. Leads 42 and 44 are connected to first contact 38 and second contact 40. A biasing device 50 feeds lead 44 and a signal source 48 feeds lead 42.

When in operation, signal source 48 delivers an electrical modulating signal to laser 30. The modulation frequency of the modulating signal is contained in the narrow band of width W containing the round-trip resonance frequency of cavity 32. This causes laser 30 to emit a sub-carrier modulated optical signal beam 52. At the same time, biasing device 50 delivers a biasing voltage to laser 30 via lead 44 and second contact 40. This biasing voltage determines the width W of the response bandwidth and peak height of the response of laser 30. The relationship between peak response and bandwidth W is inversely proportional, such that higher peak response power is obtained at the expense of reducing bandwidth W. The maximum modulation efficiency is obtained under a slight positive bias typically ranging from 0 to several Volts.

In addition to tuning the response bandwidth W of laser 30, varying the biasing voltage can be used to code information on the modulating signal. Also, biasing device 50 can help signal source 48 in generating the proper modulating signal by providing a steady bias.

Finally, the embodiment of FIG. 4 also allows for mode-locking operation. By causing signal source 48 and biasing device 50 to apply a forward bias and a reverse bias respectively one can achieve very efficient mode-locking. This means that a strong oscillation is produced at c/2nL. The laser can also be configured as shown in FIG. 6 (discussed below) to achieve this self-oscillation or saturable absorber mode-locking.

Figure 5:
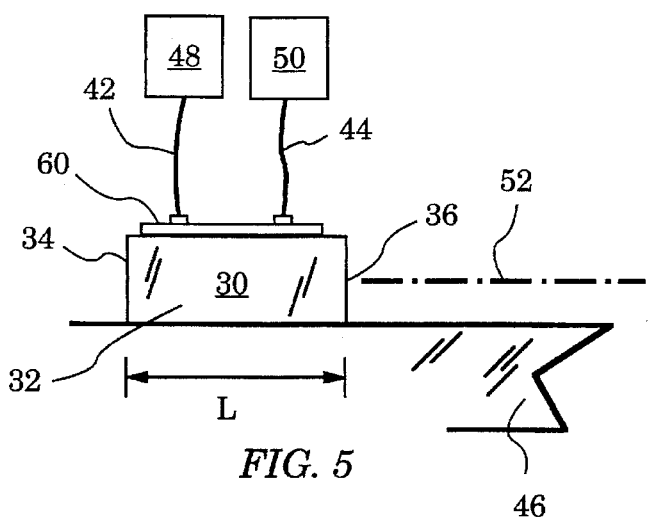
FIG. 5 is a side view of a semiconductor laser with one contact according to the invention.

FIG. 5 shows yet another embodiment of the invention. This embodiment is closely related to that of FIG. 4 and the same reference numbers are used for all corresponding parts. The difference is that only one in-coupling contact 60 is used. The embodiment's operation is analogous to the embodiment of FIG. 4. Active mode-locking or resonant modulation, as opposed to saturable mode-locking mentioned above, can be achieved in this embodiment. Since frequency of signal source 48 is sufficiently high it is electrically confined to contact 60. This effectively eliminates the need for a second contact to achieve mode-locking (coupling). Such a single contact solution lowers the cost of the laser and simplifies its construction.

Figure 6:
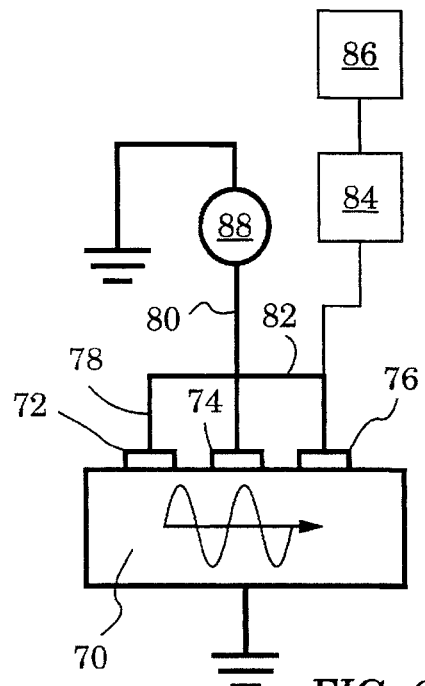
FIG. 6 is a connection diagram of a semiconductor laser with three contacts according to the invention.

FIG. 6 shows a practical embodiment of the invention employing a GaAs quantum well diode laser 70 with three in-coupling contacts 72, 74, and 76. All contacts 72, 74, and 76 are joined by leads 78, 80, and 82, respectively. Furthermore, laser 70 is grounded through a substrate (not shown) or otherwise. A signal source 86 is connected via an impedance matching device 84, preferably a microstrip impedance matching circuit, to lead 82. Impedance matching circuit 84 is selected to improve the in-coupling efficiency of the electrical modulating signal from source 86. The impedance, Z, of matching circuit 84 is chosen according to measurements of the electrical parameters (parasitics) of laser 70 along with contacts 72, 74, and 76 and the substrate on which laser 70 is mounted.

A biasing device 88 is connected to the contacts via lead 80. For better voltage stability biasing device 88 is grounded. The function of device 88 is to provide a DC biasing voltage, preferably a forward bias, as in the previous embodiment. In particular, device 88 is capable of delivering a gain current, $I_g$, ranging from several mA to a few hundred mA and more to laser 70.

Figure 7:
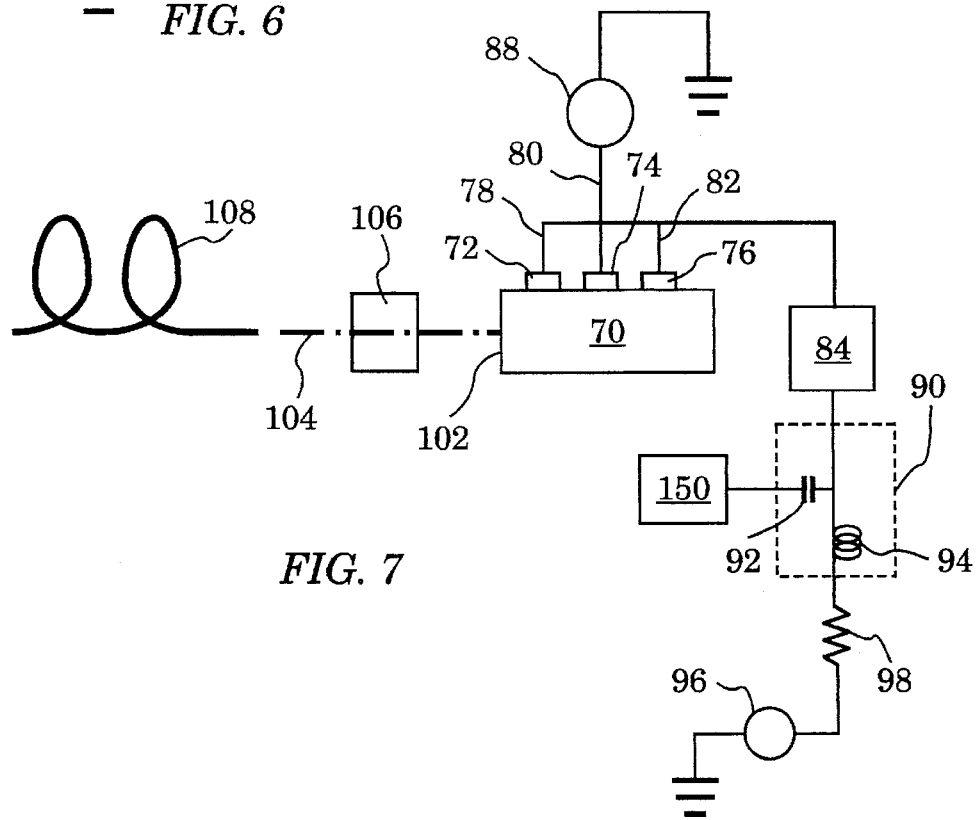
FIG. 7 is a schematic diagram of the apparatus of the invention.

With impedance matching circuit 84 and biasing device 88 the embodiment of FIG. 6 has all the necessary adjustments for practical applications using available GaAs diode lasers. FIG. 7 illustrates a complete signal transmission arrangement which employs laser 70. For purpose of clarity, the same parts have been labelled with the same reference numbers as in FIG. 6.

Laser 70 is set up as in FIG. 6 except that impedance matching circuit 84 is now connected to a bias tee 90, which includes a capacitor 92 and an inductance element 94, e.g., a standard solenoid. A grounded absorber biasing device 96 is connected via a resistor 98 to the inductance element 94 of bias tee 90. Device 96 is designed to deliver an DC biasing voltage to the absorbing section of laser 70.

A signal source 150 is connected to tee 90 through capacitor 92. In the present embodiment source 150 is capable of transmitting digital signals at 45 GHz. In particular, source 100 is set up to transmit differential-phase-shift-keyed (DPSK) data at 50 Mb/sec. Laser 70 has an output facet 102 from which a sub-carrier modulated optical signal beam 104 issues during operation. An isolator 106 is positioned in the path of signal beam 104 to ensure the purity of beam 104, filter out stray light, and prevent light from beam 104 from being reflected back into laser 70.

Figure 8:
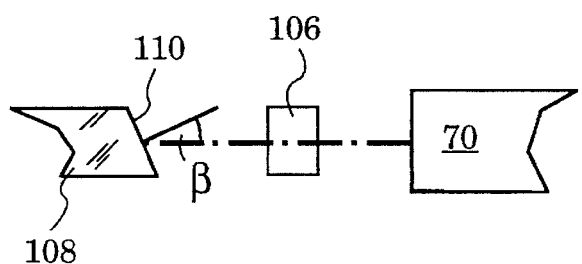
FIG. 8 is a detailed schematic of a portion of the apparatus of FIG. 7.

For convenience, an optical fiber 108 is used to further transmit signal beam 104. The geometrical positioning of fiber 108 with respect to output facet 102 and isolator 106 is shown in more detail in FIG. 8. Fiber 108 has an in-coupling face 110 which is arranged at a Brewster angle β to incident beam 104 arriving from isolator 106. This guarantees efficient in-coupling of pure signal beam 104 into fiber 108. Of course, it is possible to couple beam 104 directly from output facet 102 into fiber 108. In the simplest case this is done, e.g., by polishing face 110 and bonding it to output facet 102 with an adhesive agent. Such junctions and methods for producing them are well-known in the art.

During operation DC biasing device 88 delivers a gain current, $I_g$, through lead 80 to laser 70. Simultaneously, absorber biasing device 96 delivers a DC biasing signal in tune with source 150, which delivers a DPSK information signal at a frequency of 45 GHz and a data rate of, e.g., 50 Mb/sec. The DC biasing signal is superposed on the DPSK information signal and both are efficiently coupled into laser 70 by impedance matching circuit 84.

Laser 70 responds to these input signals by generating a sub-carrier modulated optical signal beam 104, which is emitted through output facet 102. Signal beam 104 then passes through isolator 106 and enters optical fiber 108 through in-coupling face 110. From there, signal beam 104 can be transmitted conveniently by any suitable optical system to a receiver (not shown).

In one particular application of the above embodiment, a 50 Mb/sec DPSK information signal was transmitted at a bit error rate (BER) of less than $10^{-9}$ over several meters of optical fiber 108. The absorber bias voltage in this instance was −0.44 Volts and the gain current, $I_g$, of biasing device 88 was 68 mA. With these parameters the carrier-to-noise ratio (CNR) achieved is 90 dB (1 Hz), the bandwidth W is 115 MHz, at a modulation efficiency of 10 dB.

Figure 9:
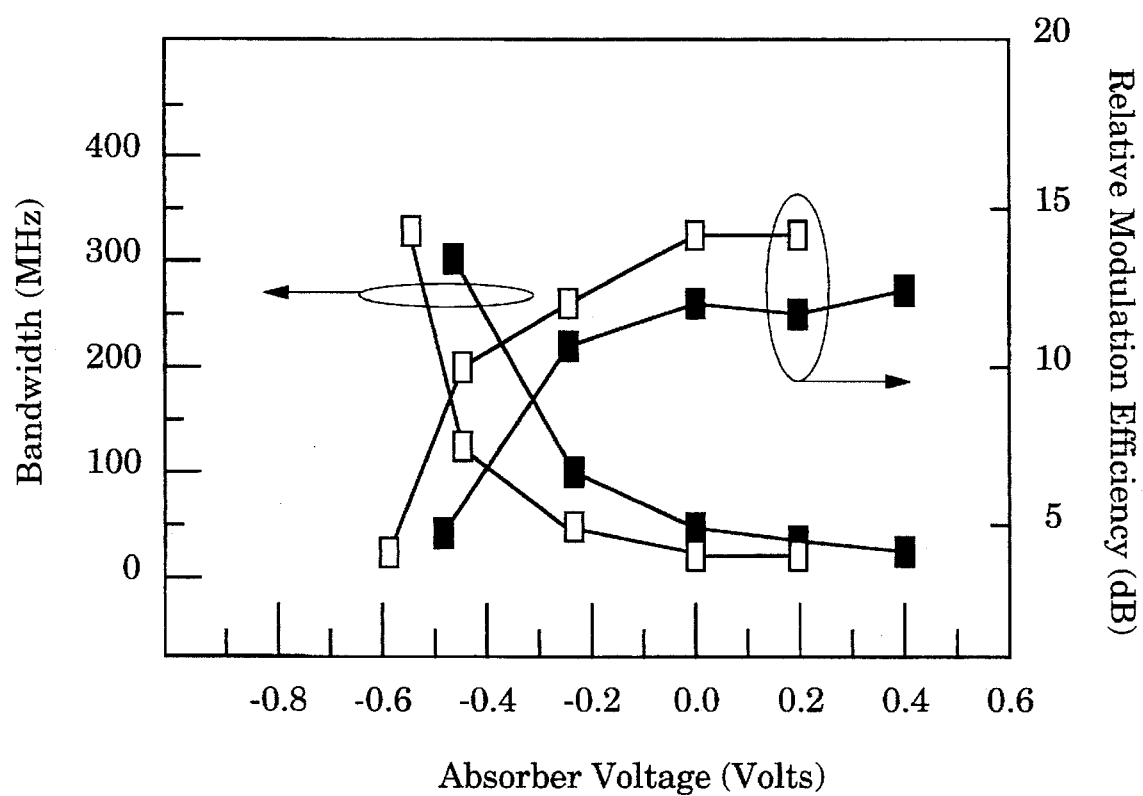
FIG. 9 is a graph of the peak modulation efficiency and passband width vs. absorber voltage for fixed gain currents and radio-frequency drive power settings in the apparatus of the invention.

FIG. 9 shows a graph of the peak modulation efficiency and bandwidth W versus the voltage of absorber biasing device 96. The gain currents and radio-frequency drive power settings in the apparatus of the invention are fixed. For the empty rectangles $I_g$=68 mA, and for the filled rectangles $I_g$=62 mA. The drive power is 10 dBm. A person skilled in the art will be able to use this graph to determine the ideal transmission parameters for signal beam 104.

SUMMARY, RAMIFICATIONS, AND SCOPE

We have presented apparatus and method for converting millimeter-wave electrical signals to sub-carrier modulated optical signal beams whose sub-carrier frequency ranges from 20 to 300 GHz. A number of such narrow-band apparatuses are used to cover the entire frequency range from 20 to 300 GHz.

The apparatus is simple in construction, efficient, and low-cost, since, in most cases, standard semiconductor lasers can be used. The various biasing options disclosed allow one to precisely tune the response of the apparatus and modulate information onto a sub-carrier modulated optical signal beam. For better transmission, the invention also teaches how to in-couple the modulated optical signal beam into an optical waveguide such as an optical fiber.

Many improvements and modifications can be made to the embodiments described above by using the teaching of the invention. Therefore, the scope of the invention should be determined, not by examples given, but by the appended claims and their legal equivalents.

I claim:

1. An apparatus for optically transmitting a narrow-band electrical signal having a frequency in the 20 to 300 GHz range, said apparatus comprising:

a) a semiconductor laser with a lasing cavity having a length L for sustaining a laser beam, said lasing cavity having a round-trip distance defined by twice said length L, said round-trip distance corresponding to a round-trip resonance frequency;

b) a signal source for generating an electrical modulating signal having a modulation frequency contained in a narrow band, said narrow band comprising said round-trip resonance frequency;

c) an in-coupling means mounted on said semiconductor laser for delivering said electrical modulating signal to said semiconductor laser, thereby producing a sub-carrier modulated optical signal beam whose sub-carrier modulation frequency is comprised within a response band and corresponds approximately to said modulation frequency.

2. The apparatus of claim 1, further comprising an impedance matching means connected between said signal source and said in-coupling means for improving the in-coupling efficiency of said modulating signal into said semiconductor laser.

3. The apparatus of claim 2, wherein said impedance matching means is a microstrip impedance matching circuit.

4. The apparatus of claim 1, wherein said length L ranges from less than 1 millimeter to 10 millimeters, thereby defining said round-trip resonance frequency according to the following equation:

$$\text{round-trip resonance frequency} = \frac{c}{2nL}$$

wherein c is the speed of light and n is the refractive index of the material making up said semiconductor laser.

5. The apparatus of claim 1, further comprising a biasing means, said biasing means being connected to said in-coupling means for providing a biasing voltage for tuning said response band and said sub-carrier modulated optical signal beam.

6. The apparatus of claim 5, wherein said in-coupling means comprises a first contact and a second contact, said signal source being connected to said first contact and said biasing means being connected to said second contact.

7. The apparatus of claim 5, wherein said in-coupling means comprises a contact, said signal source and said biasing means being connected to said contact.

8. The apparatus of claim 1, further comprising:

a) an optical coupling element for extracting said sub-carrier modulated optical signal beam from said semiconductor laser; and b) an optical fiber connected to said optical coupling element for receiving and transmitting said sub-carrier modulated optical signal beam.

9. The apparatus of claim 8 wherein said semiconductor laser has an output facet, said optical fiber has an in-coupling face, and said optical coupling element is an optical material located between said output facet and said in-coupling face, such that said sub-carrier modulated optical signal beam exiting through said output facet passes through said optical material to said in-coupling face.

10. The apparatus of claim 9 wherein said in-coupling face of said optical fiber is positioned at a Brewster angle to said output facet, such that said sub-carrier modulated optical signal beam is efficiently in-coupled into said optical fiber.

11. The apparatus of claim 1, wherein said semiconductor laser is selected from the group containing a Fabry-Perot laser, a Distributed Feedback laser, and a Distributed Bragg Reflector laser.

12. A method for optically transmitting a narrow-band electrical signal having a frequency in the 20 to 300 GHz range using a semiconductor laser with a lasing cavity, said method comprising the following steps:

a) cleaving said semiconductor laser such that said lasing cavity has a length L, thereby setting a round-trip distance of said lasing cavity to twice said length L, said round-trip distance corresponding to a round-trip resonance frequency;

b) generating an electrical modulating signal using a signal source, said electrical modulating signal having a modulation frequency contained in a narrow band, said narrow band comprising said round-trip resonance frequency;

c) in-coupling said electrical modulating signal into said semiconductor laser using an in-coupling means mounted on said semiconductor laser, thereby producing a sub-carrier modulated optical signal beam whose sub-carrier modulation frequency is comprised within a response band and corresponds approximately to said modulation frequency.

13. The method of claim 12, further comprising the step of biasing said semiconductor laser by applying a biasing voltage to said in-coupling means.

14. The method of claim 13, wherein said biasing voltage is used to set the width of said response band.

15. The method of claim 13, wherein said biasing voltage is used to set a phase shift in said sub-carrier modulated signal beam.

16. The method of claim 15, wherein said phase shift is varied by changing said biasing voltage to phase-modulate said sub-carrier modulated signal beam.

17. The method of claim 12, wherein said sub-carrier modulated optical signal beam is extracted from said lasing cavity and in-coupled into an optical fiber.

* * * * *